(12) United States Patent
Hinsch et al.

(10) Patent No.: US 10,468,196 B2
(45) Date of Patent: Nov. 5, 2019

(54) PHOTOVOLTAIC ELEMENTS HAVING LONG-TERM STABILITY THAT CAN BE PRECIPITATED OUT OF SOLUTIONS, AND IN-SITU METHOD FOR PRODUCING SAID ELEMENTS

(71) Applicant: Fraunhofer-Gesellschaft zur Förderung der angewandten Forschung e.V., München (DE)

(72) Inventors: Andreas Hinsch, Oberried (DE); Henning Brandt, Freiburg (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 14/913,877

(22) PCT Filed: Aug. 25, 2014

(86) PCT No.: PCT/EP2014/067983
§ 371 (c)(1),
(2) Date: Feb. 23, 2016

(87) PCT Pub. No.: WO2015/025058
PCT Pub. Date: Feb. 26, 2015

(65) Prior Publication Data
US 2016/0203918 A1     Jul. 14, 2016

(30) Foreign Application Priority Data

Aug. 23, 2013  (DE) ................ 10 2013 216 848

(51) Int. Cl.
*H01G 9/20*     (2006.01)
*H01G 9/00*     (2006.01)
(Continued)

(52) U.S. Cl.
CPC ........ *H01G 9/2022* (2013.01); *H01G 9/0029* (2013.01); *H01G 9/204* (2013.01);
(Continued)

(58) Field of Classification Search
CPC ..................... H01G 9/2022; H01L 51/0036
(Continued)

(56) References Cited

U.S. PATENT DOCUMENTS 8,237,050 B2    8/2012 Hinsch et al.
2008/0092946 A1*  4/2008 Munteanu ............. H01L 31/032
                                                 136/252
(Continued)

FOREIGN PATENT DOCUMENTS

CN   102129911 A   7/2011
CN   102365696 A   2/2012
(Continued)

OTHER PUBLICATIONS

Ito et al., "Fabrication of thin film dye sensitized solar cells with solar to electric power conversion efficiency over 10%", Thin Solid Films 516 (2008) pp. 4613-4619.*
(Continued)

*Primary Examiner* — Tae-Sik Kang

(57) ABSTRACT

The present invention relates to a photovoltaic element comprising
one front electrode and one further electrode comprising respectively one glass substrate and one electrically conductive electrode layer which is disposed on the glass substrate,
at least two porous carrier layers which are disposed between the two electrodes, the two electrodes being connected to the adjacent porous carrier layers without a spatial interval,
a plurality of glass solder webs disposed between the two electrodes for fixing the at least two porous carrier layers, and (Continued)

at least one photovoltaically active material which is introduced into the at least two porous carrier layers and has a concentration gradient.

11 Claims, 1 Drawing Sheet

(51) Int. Cl.
- *H01L 51/00* (2006.01)
- *H01L 51/42* (2006.01)
- *H01L 51/44* (2006.01)

(52) U.S. Cl.
CPC ......... *H01G 9/2018* (2013.01); *H01G 9/2031* (2013.01); *H01G 9/2059* (2013.01); *H01L 51/0032* (2013.01); *H01L 51/0036* (2013.01); *H01L 51/0046* (2013.01); *H01L 51/4226* (2013.01); *H01L 51/448* (2013.01); *Y02E 10/549* (2013.01); *Y02P 70/521* (2015.11)

(58) Field of Classification Search
USPC ............................................ 136/256; 438/64
See application file for complete search history.

(56) References Cited

U.S. PATENT DOCUMENTS

| | | | |
|---|---|---|---|
| 2009/0133741 | A1 | 5/2009 | Higuchi et al. |
| 2010/0012166 | A1 | 1/2010 | Yamanaka et al. |
| 2011/0155237 | A1* | 6/2011 | Myung ................ H01G 9/2068 136/256 |
| 2012/0042930 | A1 | 2/2012 | Yamanaka et al. |
| 2012/0103400 | A1 | 5/2012 | Chiba et al. |
| 2012/0132280 | A1 | 5/2012 | Nagano et al. |
| 2012/0306053 | A1 | 12/2012 | Shum et al. |

FOREIGN PATENT DOCUMENTS

| | | |
|---|---|---|
| DE | 112006002294 | 10/2008 |
| EP | 1442486 | 8/2004 |
| JP | 2010009786 | 1/2010 |
| WO | WO-1996029716 | 9/1996 |
| WO | WO-2005096391 | 10/2005 |
| WO | WO-2009064100 | 5/2009 |
| WO | WO-2015025058 | 2/2015 |

OTHER PUBLICATIONS

Hayase et al., "Development Technology of Dye-Sensitized Solar Cells—Manufacturing of Dye Sensitized Solar Cells on Larger Scale", edited by Hayase Shuji and Fujishima Akira, Gijutsu Kyoiku, Jun. 2003, pp. 205-217.*
Im et al., "6.5% efficient perovskite quantum-dot-sensitized solar cell", Nanoscale, 2011, 3, pp. 4088-4093.*
"International Application No. PCT/EP2014/067983, International Preliminary Report on Patentability dated Mar. 3, 2016", (w/ English Translation), 16 pgs.
"German Application No. 10 2013 216 848.9, Office Action dated May 27, 2014", (May 27, 2014), 6 pgs.
"International Application No. PCT/EP2014/067983, International Search Report and Written Opinion dated Jan. 7, 2015", (Jan. 7, 2015), 13 pgs.
Sadamasu, Kengo, et al., "Hybrid Dye-Sensitized Solar Cells Consisting of Double Titania Layers for Harvesting Light with Wide Range of Wavelengths", Applied Physics Express, vol. 4, No. 2 (2011), (Dec. 21, 2011), 3 pgs.
Sastrawan, R., et al., "New Interdigital Design for Large Area Dye Solar Modules Using a Lead-free Glass Frit Sealing", Prog. Photovolt: Res. Appl. 2006; 14(8):697-709, (Jun. 19, 2006), 697-709.
Tian, Zhipeng, et al., "Multilayer structure with gradual increasing porosity for dye-sensitized solar cells", Applied Physics Letters, vol. 94, No. 3 (2009), (Jan. 23, 2009), 3 pgs.
"Chinese Application No. 201480046735.6, Office Action dated May 22, 2017", w/ English Summary, (May 22, 2017), 35 pgs.
"European Office Action 14 761 297.2 dated Nov. 16, 2017", w/ English Translation, (Nov. 16, 2017), 12 pgs.
"Japanese Application Serial No. 2016-535503, Office Action dated Jul. 3, 2018", w/ English Translation, (Jul. 3, 2018), 17 pgs.
Tian, Zhipeng, et al., "Multilayer structure with gradual increasing porosity for dye-sensitized solar cells", Applied Physics Letters 94.3, (2009), 031905.

* cited by examiner

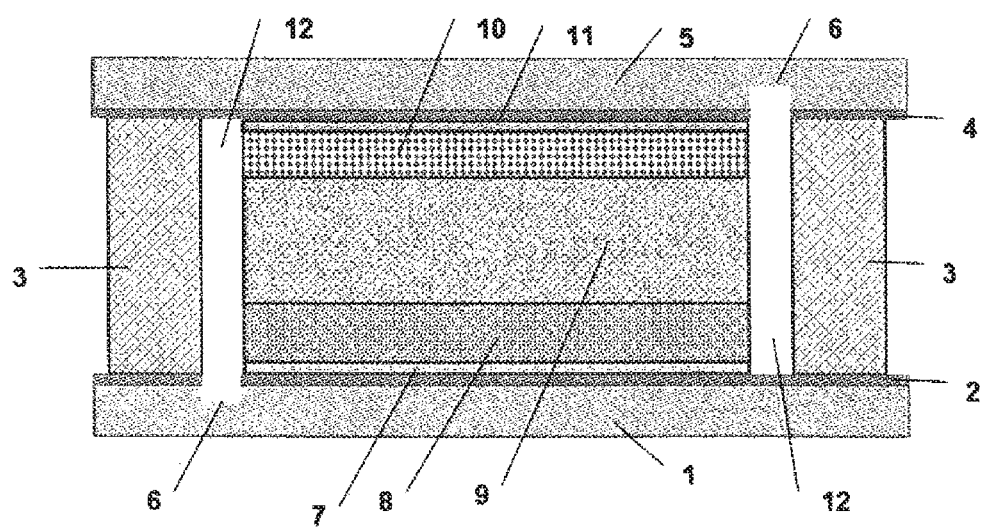

PHOTOVOLTAIC ELEMENTS HAVING LONG-TERM STABILITY THAT CAN BE PRECIPITATED OUT OF SOLUTIONS, AND IN-SITU METHOD FOR PRODUCING SAID ELEMENTS

PRIORITY CLAIM TO RELATED APPLICATIONS

This application is a U.S. national stage application filed under 35 U.S.C. § 371 from International Application Serial No. PCT/EP2014/067983, which was filed 25 Aug. 2014, and published as WO2015/025058 on 26 Feb. 2015, and which claims priority to German Application No. 10 2013 216 848.9, filed 23 Aug. 2013, which applications and publication are incorporated by reference as if reproduced herein and made a part hereof in their entirety, and the benefit of priority of each of which is claimed herein.

TECHNICAL FIELD

The present invention relates to a photovoltaic element which, in addition to one front electrode and one further electrode, comprises at least two porous carrier layers, a plurality of glass solder webs and at least one photovoltaic material. The two electrodes thereby comprise respectively one glass substrate and respectively one electrically conductive electrode layer which is disposed on the glass substrate. The at least two porous carrier layers are disposed between the two electrodes, the two electrodes being connected to the adjacent porous carrier layers without a spatial interval. The glass solder webs are disposed between the two electrodes for fixing the at least two porous carrier layers. The at least one photovoltaically active material is introduced into the at least two porous carrier layers and has a concentration gradient. In addition, the present invention relates to an in situ method for the production of a photovoltaic element according to the invention and also to a module which consists of at least two of the photovoltaic elements according to the invention.

BACKGROUND OF THE INVENTION

The technical field of the present invention relates to the production of solar cells or photovoltaic elements and modules. The state of the art, in particular WO 96/29716 and WO 2005/096391 A3, describe a special embodiment of nanoscale solar cells in this respect, so-called dye-sensitised solar cells in a two-electrode structure which can be sealed between two sheets of glass by means of glass solder.

Such nanoscale solar cells can be produced from a multiplicity of photovoltaically active materials. For the term nanoscale solar cells, often other terms are also chosen in scientific literature. In part, e.g. mesoscopic solar cells are mentioned. EP 1442486 chooses, in contrast, the term "bulk-heterojunction" solar cells. The latest approaches, such as for example in US 2012/0306053 A1, are also termed "perovskite" solar cells. A very interesting aspect of these solar cell concepts is thereby that the photovoltaically active materials can be precipitated from solutions.

The requirement for commercialisation of nanoscale solar cells resides in producing them by means of the most simple production methods, with minimal material consumption and long-term-stable properties. These three requirements are not compatible with the present state of the art.

SUMMARY

Starting from the state of the art, it is hence the object of the present invention to indicate a photovoltaic element which, on the one hand, has excellent properties with respect to long-term stability but, on the other hand, is producible also by means of an uncomplicated production method and with minimal material consumption.

According to the invention, a photovoltaic element which, in addition to one front electrode and one further electrode, comprises at least two porous carrier layers, a plurality of glass solder webs and at least one photovoltaic material is hence indicated. The two electrodes thereby comprise respectively one glass substrate and one electrically conductive electrode layer which is disposed on the glass substrate and in fact on the side which is orientated towards the respectively other electrode. The at least two porous carrier layers are disposed between the two electrodes, the two electrodes being connected to the adjacent porous carrier layers without a spatial interval. The glass solder webs are disposed between the two electrodes for fixing the at least two porous carrier layers. The at least one photovoltaically active material is introduced into the at least two porous carrier layers and has a concentration gradient.

The invention is distinguished by the glass solder webs being disposed between the two electrodes such that the two electrodes are connected to the adjacent porous carrier layers without a spatial interval, as a result of which the photovoltaic element has great long-term stability. This can be achieved by the two electrodes being sealed to be stable over the long term by the melted-on glass solder webs in a thermal fusing process so that, in contrast to the previously known state of the art, in fact no spatial interval is produced between the porous carrier layers and the electrodes. This is possible since the process of fusing the sheets of glass takes place above the softening temperature of the glass solder webs and also of the glass substrates, and hence the sheets of glass are deposited one on the other in their entirety, i.e. without a spacing, and thus the solidifying glass solder fixes the electrodes permanently during cooling.

According to the invention, it has been recognised that, during use and also production according to the invention of a photovoltaic element according to the invention, many advantages can be achieved relative to the embodiments of the prior art.

Firstly, great long-term stability can be ensured by sealing at high temperatures by means of melted-on glass solder webs. Sealing at such high temperatures is thereby possible as a result of the fact that porous non-organic carrier layers are used.

Furthermore, the inner surface of the carrier layers is coated by drying as a result of subsequent introduction of the photovoltaically active materials into the cell by means of solutions. Hence, in contrast to existing methods, the necessity for an additional complex macroscopic coating process for the photovoltaically active materials is dispensed with.

In addition, simple inert handling of the photovoltaically active materials in closed tube systems is possible. Hence complex vacuum- or inert gas techniques can be dispensed with.

Likewise, the requirements for safety precautions when dealing with the materials, the solvents and the drying processes are greatly reduced.

A further advantage is that, by minimising the spacing of the glass substrates, a reduction in material consumption of the photovoltaically active material becomes possible.

According to the invention, float glass, such as e.g. soda-lime glass or borosilicate glass, can be used as material for the glass substrates.

As material for the glass solder webs, low-melting glass, e.g. based on zinc-aluminium-silicate, can be used according to the invention.

A preferred embodiment of the invention provides that the electrically conductive electrode layer disposed on the front electrode and/or the electrically conductive electrode layer disposed on the further electrode have a transparent design. A degree of transmission of at least 70% in a wavelength range of 400-1,100 nm is hereby achieved.

In a further preferred embodiment, the at least two porous carrier layers have a different pore size, preferably the porous carrier layer next to the front electrode having the smallest pore size and the pore size of the porous carrier layers increasing at increasing distance from the front electrode. With reducing pore size, the specific inner surface of the carrier layers and hence also the capillary effect increases.

This preferred embodiment hence indicates the preferred possibility of ensuring that the at least once photovoltaically active material has a concentration gradient if it is introduced into the porous carrier layer.

The inner surface of the porous carrier layers is hence configured such that a differentiated, spatially directed configuration of the photovoltaic element results therefrom. By means of skilled exploitation of the properties of the at least two porous carrier layers, such as porosity, surface size, adhesion points and wetting, a spatially selective, self-organised, directed adsorption and coating with the at least one photovoltaically active material is hereby achieved.

A further preferred embodiment of the invention provides that the at least two porous carrier layers are designed to be electrically conductive or electrically insulating. An influence on the electrical conductivity can thereby be achieved for example by reactive gases and/or solutions which comprise electrically conductive materials being introduced into the at least two porous carrier layers.

Furthermore, it is preferred that the extension of the at least two porous carrier layers between adjacent glass solder webs is 3 to 10 mm and/or the thickness of all of the at least two porous carrier layers in total is 0.5 to 20 µm, preferably 1 to 10 µm.

In a further preferred embodiment, the at least two porous carrier layers consist of a material selected from the group consisting of $TiO_2$, TiN, SiN, TiC, SiC, $Al_2O_3$, $ZrO_2$, $SiO_2$, $Fe_2O_3$, nickel oxides, chromium oxides, cobalt oxides, glass pigments, carbon black and graphite or combinations hereof.

Furthermore, it is preferred that the electrically conductive electrode layers consist of a material selected from the group consisting of $SnO_2$:F, ZnO:Al and indium tin oxide or combinations hereof.

A further preferred embodiment of the invention provides that the at least one photovoltaically active material is selected from the groups consisting of
a) organic and organometallic dyes in combination with redoxable electrolytes, preferably iodides, cobalt complexes and ferrocenes or in combination with reversibly oxidisable solids, preferably triarylammonium derivatives and spiro-OMeTAD,
b) mixtures of organic molecules and/or polymers with electron-donating and electron-accepting properties, preferably polythiophene-fullerene mixtures,
c) semiconducting inorganic materials, preferably CdTe, CdSe, $Cu_2ZnSnS_4$, $FeS_2$, PbS, $Cu_2S$, CdS, CuSCN, $Bi_2S_2$, $Cu_3BiS_3$,
d) semiconducting perovskites of the general form $K$-$M$-$A_3$ (K: cation, M: metal, A: anion), K being selected preferably from the group consisting of $Cs^+$, $CH_3NH_3^+$, $Li^+$, imidazolium cations, ammonium cations, pyridinium cations, bipyridyls, $Ca^{2+}$ and $Mg^{2+}$, M being selected preferably from the group consisting of Pb, Sn, Bi, Fe, Mn, Cu, Co, W, Ti and Zn and A being selected preferably from the group consisting of $I^-$, $Cl^-$, $F^-$, $Br^-$, $SCN^-$, $BF_4^-$, $OTf^-$, $MnO_4^-$, $O^{2-}$, $S^{2-}$ and $SO_4^{2-}$,
e) and also combinations or partial components hereof.

Furthermore, it is preferred that the front electrode and the further electrode comprise in addition respectively one electron- or hole-selective layer. These thin electron- or hole-selective layers thereby effect contacting of the at least one photovoltaically active material, which is as electrically asymmetrical (diodic) as possible, to the respective electrode layer.

The thin electron- or hole-selective layers are thereby designed preferably to be thin and preferably consist of a material selected from the group consisting of titanium dioxide, nickel oxide, tungsten oxide, iron oxide, chromium oxide, cobalt oxide, manganese oxide, molybdenum oxide, niobium oxide, copper oxide, antimony oxide, tin oxide, zinc oxide, bismuth oxide, lead oxide, cerium oxide, carbon black, platinum, silver and palladium.

In a further preferred embodiment, channel structures for pouring in solutions are introduced in a planar manner inside the front electrode and the further electrode and also between the glass solder webs and the at least two porous carrier layers. Of concern hereby are specially disposed channels and also suitable filling holes. By means of these, both the solution comprising the photovoltaically active material and also solutions which comprise chemically modifying and/or electrically conductive materials inter alia can be introduced into the at least two porous carrier layers. The corresponding solution is thereby introduced into the otherwise sealed structure via the filling holes and introduced into the carrier layers via the specially disposed channels.

As a result of this preferred embodiment, ultimately a uniform distribution of the solutions to be introduced into the at least two porous carrier layers can be achieved.

The present invention also relates to a method for the production of a photovoltaic element according to the invention.

At least two porous carrier layers and also a plurality of glass solder webs are hereby applied on a glass substrate coated with an electrically conductive electrode layer. Subsequently, sintering in air or possibly under protective gas or with reactive gases takes place in order to produce different porosity in the at least two carrier layers and to burn off the organic pressure medium in the glass solder webs. Thereupon, the front electrode and the further electrode are connected to the adjacent porous carrier layers without a spatial interval. Subsequently, the at least one photovoltaically active material is introduced into the at least two porous carrier layers. The photovoltaically active material can hereby be introduced in dissolved form into the at least two porous carrier layers, firstly a solution comprising the at least one photovoltaically active material and also at least one solvent, being introduced into the at least two porous carrier layers and, by subsequent drying, preferably by means of throughflowing gas and/or vacuum, the at least one solvent being removed.

The connection of the front electrode and the further electrode to the adjacent carrier layers can be implemented by using a fusing process, it being ensured by operating above the softening temperature of the glass solder webs and also of the glass substrates that the two electrodes are connected to the adjacent porous carrier layers without a spatial interval.

Furthermore, it is preferred that, before or after introduction of the solution comprising the at least one photovoltaically active material, reactive gases and/or solutions comprising chemically modifying and/or electrically conductive materials are introduced into the at least two porous carrier layers. Thus, for example a modification to the surface and/or an influence upon the electrical conductivity of the at least two porous carrier layers can be achieved.

Furthermore, it is preferred that the at least two porous carrier layers and/or the glass solder webs are applied by means of screen printing from a paste. The at least two porous carrier layers can in addition also be applied by curtain coating, slot-die coating or spraying.

Furthermore, it is preferred that the electrically conductive electrode layers are applied by means of spraying from a solution.

Furthermore, it is preferred that in addition respectively one thin electron- or hole-selective layer is applied on the conductive electrode layers of the front electrode and of the further electrode by means of spraying from a solution.

Furthermore, it is preferred that channel structures for pouring in solutions are introduced in a planar manner between the glass solder webs and the at least two porous carrier layers by sand blasting, mechanically, by water jet, by etching or by means of laser.

In addition, the present invention relates to a photovoltaic module comprising an internal electrical series connection of at least two photovoltaic elements according to the invention.

DETAILED DESCRIPTION

The present invention is explained in more detail with reference to the subsequent Figures and also examples without restricting the invention to the specially illustrated parameters.

FIG. 1 shows the cross-section through a photovoltaic element according to the invention. It comprises a front electrode consisting of a glass substrate (1), an electrically conductive layer (2) and a thin electron- or hole-selective layer (7) and also a further electrode consisting of a glass substrate (5), an electrically conductive layer (4) and a thin electron- or hole-selective layer (11). Between the two electrodes, three porous carrier layers (8, 9, 10) are disposed, the two electrodes being connected to the adjacent porous carrier layers without a spatial interval. Glass solder webs (3) are disposed between the two electrodes such that they fix the three porous carrier layers. The porosity of the carrier layers thereby reduces from the top to the bottom. Hence the inner surface of the carrier layers and hence the capillary effect increases from the top to the bottom. The channels (6, 12) serve for introducing solutions into the porous carrier layers.

According to the method according to the invention, photovoltaically active materials dissolved in a solvent are introduced through filling holes, distributed by the channels (6, 12) and also the uppermost carrier layer (10) in a planar manner and absorbed in the carrier layers (8, 9) lying thereunder due to capillary forces. The central carrier layer (9) hereby serves as liquid reservoir. Subsequently, the solvent is evaporated and discharged again through the uppermost carrier layer (10) and the channels (6, 12). The drying and the accompanying reduction in quantity of the solvent therefore take place from the top to the bottom. In other words, this leads to a concentration of the photovoltaically active materials and ultimately to a precipitation with a high filler content in the lowermost carrier layer (8). This carrier layer (8) hence absorbs the photovoltaically active materials which form an electrical contact to the front electrode (1, 2, 7). The electrical contacting to the second electrode (4, 5, 11) is implemented analogously, solutions made of polymeric materials which are preferably equipped to be conductive and/or materials which are equipped to be conductive with for example carbon blacks or carbon nanotubes being used for precipitation in the carrier layers (9) and (10).

The relative dimensions are represented greatly distorted in FIG. 1. The ratio of height to width is in reality $H/W = 10^{-5} - 10^{-4}$.

EXAMPLE

Sheets of float glass coated with fluorine-doped tin oxide are provided with channel structures. Subsequently, a compact approx. 20 nm thick $TiO_2$ layer (blocking layer) is applied by spray pyrolysis. Now, in succession, the carrier layers (nanoporous $TiO_2$ as lowermost 0.4 µm thick layer, highly porous $TiO_2$ as central 3 µm thick layer, microporous $Al_2O_3$ as uppermost likewise 2 µm thick layer) and the glass solder are printed onto the front electrode by screen printing and sintered at 450° C. (the different porosities and pore sizes are hereby produced in the carrier layers) and also subsequently are melted in a temperature step (650° C.) with the rear electrode by means of the printed glass solder webs. Thus a complete glass body which surrounds the printed carrier layers is produced. Merely two filling openings for introducing the active materials are now still open.

$PbI_2$ in a DMF solution (500 mg/ml) is now pressed into the layers through a filling opening and the channel structures. By means of the different pore sizes of the three carrier layers (pore size is reduced in the direction of the front electrode), the $PbI_2$ is transported into the lowermost layer on the front electrode by capillary effect. Now the DMF is dried by means of nitrogen at temperature and the active material remains in the layer. In the next step, $CH_3NH_3I$ in an isopropanol solution (10 mg/ml) is introduced into the cell structure. The material is likewise moved by means of capillary forces through the layers (in one reaction, the perovskite is now produced in the form $CH_3NH_3PbI_3$). Subsequently acetonitrile for rinsing the upper layers is pressed through the cell structure and once again dried by means of nitrogen. As last step, a solution of Spiro-OmeTAD (Merck) in chlorobenzene (100 mg/ml), mixed with electrically conductive carbon black particles (Degussa Printex), is introduced into the structure and dried once again by means of nitrogen at temperature. Finally, the filling holes are sealed and the cell structure is contacted via the TCO lying outside the glass solder webs.

The invention claimed is:

1. A photovoltaic element comprising:
    a front electrode and a further electrode wherein each of the front electrode and the further electrode comprises a glass substrate, an electrically conductive electrode layer which is disposed on the glass substrate and one electron- or hole-selective layer,
    at least two porous carrier layers which are disposed between the front electrode and the further electrode, wherein the front electrode and the further electrode are each directly connected to one of the at least two porous carrier layers without a spatial interval, a plurality of glass solder webs disposed between the front electrode and the further electrode for fixing the at least two porous carrier layers, and at least one photovoltaically active material which is introduced into the at least two porous carrier layers and has a concentration gradient wherein the at least one photovoltaically active material is a semiconducting perovskite having a general form K-M-A3, wherein K is a cation, M is a metal, and A is an anion.

2. The photovoltaic element according to claim 1, wherein the electrically conductive electrode layer of the front electrode and/or the electrically conductive electrode layer of the further electrode is transparent.

3. The photovoltaic element according to claim 1, wherein the at least two porous carrier layers have a different pore size, wherein a porous carrier layer next to the front electrode having the smallest pore size and a pore size of a porous carrier layers increasing at increasing distance from the front electrode.

4. The photovoltaic element according to claim 1, wherein the at least two porous carrier layers are electrically conductive or electrically insulating.

5. The photovoltaic element according to claim 1, wherein an extension of the at least two porous carrier layers between adjacent glass solder webs is 3 to 10 mm and/or the thickness of all of the at least two porous carrier layers in total is 0.5 to 20 μm.

6. The photovoltaic element according to claim 1, wherein the at least two porous carrier layers consist of a material selected from the group consisting of $TiO_2$, TiN, SiN, TiC, SiC, $Al_2O_3$, $ZrO_2$, $SiO_2$, $Fe_2O_3$, nickel oxides, chromium oxides, cobalt oxides, glass pigments, carbon black, graphite, and combinations thereof.

7. The photovoltaic element according to claim 1, wherein the electrically conductive electrode layer consists of a material selected from the group consisting of $SnO_2$:F, ZnO:Al, indium tin oxide, and combinations thereof.

8. The photovoltaic element according to claim 1, wherein the electron- or hole-selective layer comprises a material selected from the group consisting of titanium dioxide, nickel oxide, tungsten oxide, iron oxide, chromium oxide, cobalt oxide, manganese oxide, molybdenum oxide, niobium oxide, copper oxide, antimony oxide, tin oxide, zinc oxide, bismuth oxide, lead oxide, cerium oxide, carbon black, platinum, silver and palladium.

9. The photovoltaic element according to claim 1, wherein channel structures for pouring in solutions are introduced inside the front electrode and the further electrode and also between the glass solder webs and the at least two porous carrier layers.

10. The photovoltaic element according to claim 1, wherein in the semiconducting perovskites of the general form K-M-A3 the K is selected from the group consisting of $Cs^+$, $CH_3NH_3^+$, $Li^+$, imidazolium cations, ammonium cations, pyridinium cations, bipyridyls, $Ca^{2+}$ and $Mg^{2+}$, M is selected from the group consisting of Pb, Sn, Bi, Fe, Mn, Cu, Co, W, Ti and Zn and A is selected from the group consisting of $I^-$, $Cl^-$, $F^-$, $Br^-$, $SCN^-$, $BF_4^-$, $OTf^-$, $MnO_4^-$, $S^{2-}$, and $SO_4^{2-}$.

11. A photovoltaic module comprising an internal electrical series connection of at least two photovoltaic elements, each including:

a front electrode and a further electrode wherein each of the front electrode and the further electrode comprises a glass substrate, an electrically conductive electrode layer which is disposed on the glass substrate and one electron- or hole-selective layer, at least two porous carrier layers which are disposed between the front electrode and the further electrode, wherein the front electrode and the further electrode are each directly connected to one of the at least two porous carrier layers without a spatial interval, a plurality of glass solder webs disposed between the front electrode and the further electrode for fixing the at least two porous carrier layers, and at least one photovoltaically active material which is introduced into the at least two porous carrier layers and has a concentration gradient wherein the at least one photovoltaically active material is a semiconducting perovskite having a general form K-M-A3, wherein K is a cation, M is a metal, and A is an anion.

* * * * *